US009753431B2

(12) United States Patent
Xie et al.

(10) Patent No.: US 9,753,431 B2
(45) Date of Patent: Sep. 5, 2017

(54) VISIBLE LIGHT PHOTOINITIATING SYSTEM FOR PREPARING HIGH DIFFRACTION EFFICIENCY HOLOGRAM OPTICAL POLYMER MATERIAL

(75) Inventors: Xiaolin Xie, Wuhan (CN); Haiyan Peng, Wuhan (CN); Xingping Zhou, Wuhan (CN); Chengfu Zheng, Wuhan (CN); Hongwei Ge, Wuhan (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 150 days.

(21) Appl. No.: 14/131,676

(22) PCT Filed: May 25, 2012

(86) PCT No.: PCT/CN2012/076050
§ 371 (c)(1),
(2), (4) Date: Jan. 8, 2014

(87) PCT Pub. No.: WO2013/016973
PCT Pub. Date: Feb. 7, 2013

(65) Prior Publication Data
US 2014/0193748 A1 Jul. 10, 2014

(30) Foreign Application Priority Data
Jul. 29, 2011 (CN) .......................... 2011 1 0215653

(51) Int. Cl.
| | |
|---|---|
| C08F 2/52 | (2006.01) |
| C08F 2/42 | (2006.01) |
| G03H 1/04 | (2006.01) |
| C08F 2/50 | (2006.01) |
| G03F 7/00 | (2006.01) |
| G03F 7/029 | (2006.01) |
| G03F 7/031 | (2006.01) |
| G11B 7/24044 | (2013.01) |
| G11B 7/245 | (2006.01) |
| G03H 1/18 | (2006.01) |

(52) U.S. Cl.
CPC ................ *G03H 1/04* (2013.01); *C08F 2/50* (2013.01); *G03F 7/001* (2013.01); *G03F 7/029* (2013.01); *G03F 7/031* (2013.01); *G03H 1/181* (2013.01); *G11B 7/245* (2013.01); *G11B 7/24044* (2013.01); *G03H 2260/12* (2013.01)

(58) Field of Classification Search
CPC ..... C08F 2/46; C08F 2/50; C08F 2/52; G03H 1/041; G03H 1/181; G03F 7/001; G03F 7/029; G03F 7/031; G11B 7/245
See application file for complete search history.

(56) References Cited

U.S. PATENT DOCUMENTS

| | | | | |
|---|---|---|---|---|
| 6,025,406 A | * | 2/2000 | Oxman et al. | ................... 522/14 |
| 2010/0215865 A1 | * | 8/2010 | Keoshkerian | ........... B41C 1/003 |
| | | | | 427/511 |
| 2013/0123381 A1 | * | 5/2013 | Bowman et al. | ............... 522/42 |

FOREIGN PATENT DOCUMENTS

| | | |
|---|---|---|
| CN | 1878854 A | 12/2006 |
| CN | 102344530 A | 2/2012 |
| JP | 560-88005 A | 5/1985 |
| WO | WO 2005/050785 | 6/2005 |

OTHER PUBLICATIONS

Fouassier et al. Photopolymerization reactions under visible lights: principle, mechanisms and examples of applications. Progress in Organic Coatings. 47 (2003), 16-36.*
Allonas, X., Fouassier, J.-P., Angiolini, L. and Caretti, D. (2001), Excited-State Properties of Camphorquinone Based Monomeric and Polymeric Photoinitiators. HCA, 84: 2577-2588.*

* cited by examiner

*Primary Examiner* — Sanza McClendon
(74) *Attorney, Agent, or Firm* — Davis Wright Tremaine LLP

(57) ABSTRACT

The present invention provides a visible light photoinitiating system for preparing a holographic photopolymer material with high-diffraction efficiency. The photoinitiating system comprises a photosensitizer and a co-initiator, and its mechanism is that the photosensitizer transforms from ground state to excited state after absorbing photons, and then interacts with the co-initiator through transfer of electrons and protons, which produces an alkyl (or aryl) free radical R and a ketyl radical K; wherein the free radical R initiates the addition polymerization of monomers that are capable of free radical polymerization, whereas the radical K inhibits the chain propagation of the macromolecular free radicals to a certain degree due to the steric hindrance effect, and thus delays the gelation time of the photopolymerization, which helps to increase the phase separation between the polymer and the functional components. A holographic photopolymer material with high-diffraction efficiency can be obtained by employing this visible light photoinitiating system.

8 Claims, No Drawings

VISIBLE LIGHT PHOTOINITIATING SYSTEM FOR PREPARING HIGH DIFFRACTION EFFICIENCY HOLOGRAM OPTICAL POLYMER MATERIAL

CROSS-REFERENCE TO RELATED APPLICATIONS

The present application is a U.S. National Stage entry under 35 U.S.C. §371 of International Application No. PCT/CN2012/076050, filed on May 25, 2012, designating the United States of America and published in Chinese on Feb. 7, 2013, which in turn claims priority to Chinese Application No. 201110215653.8, filed on Jul. 29, 2011, each of which is hereby incorporated by reference in its entirety.

TECHNICAL FIELD

The present invention pertains to the functional material field, and relates to a visible light photoinitiating system for preparing a holographic photopolymer material with high-diffraction efficiency.

BACKGROUND ART

Characterized by high diffraction efficiency and environment-independent stability, a holographic photopolymer material is a recording medium that stores holographic information by using the laser holography technology. Its precursor typically comprises a photoinitiating system, polymerizable monomers, agglomerant, plasticizer, and other functional components (including but not limited to, liquid crystals, $SiO_2$, $TiO_2$, POSS, and carbon nano-tubes). It is obtained by illuminating the precursor with two or more coherent laser beams. During the process of preparing the holographic photopolymer material, the gelation process of the polymer network competes against the diffusion process of monomers and other functional components. Perfect phase separation can be attained for preparing a holographic photopolymer material with high-diffraction efficiency only when the diffusion rate is higher than the gelation rate. To overcome the gelation problem during the polymerization, Natarajan et al adopted the thiol-ene click reaction to control the gelation time of the photopolymerization system (Chem. Mater. 2003, 15 (12): 2477-2484; Macromolecules 2007, 40 (4): 1121-1127), but that reaction didn't afford perfect phase separation and high diffraction efficiency. After discovering that the free radicals generated by ultra-violet lights can inhibit the addition polymerization initiated by visible lights, Scott used the free radicals generated by 364 nm lasers to reduce the photopolymerization reactivity initiated by 473 nm lasers, thus effectively deferring the gelation time of the polymerization (Science 2009, 324 (5929): 913-917). However, this approach involves lasers of two different wavelengths, thus incurring additional equipment costs. To overcome this problem, a photoinitiating system is invented to improve the phase separation of the holographic photopolymer material by deferring the gelation time in the photopolymerization. The photoinitiating system allows a single laser beam to simultaneously generate two different types of free radicals, one of which initiates photopolymerization and the other one inhibits photopolymerization, making it possible to continuously adjust the gelation time in the photopolymerization and to prepare a holographic polymer material with high diffraction efficiency.

SUMMARY OF THE INVENTION

This invention is intended to provide a visible light photoinitiating system for preparing a holographic photopolymer material with high diffraction efficiency.

The technical solution of the invention is described as follows:

The visible light photoinitiating system for preparing a holographic photopolymer material with high diffraction efficiency according to the invention comprises a photosensitizer and a co-initiator.

The photoinitiating system is characterized in that the ratio by mass of the photosensitizer to the coinitiator is between 20:1 and 1:20.

The photosensitizer is one or more of C1, C2, C3, C4 and C5, and the C1, C2, C3, C4 and C5 have the following structures respectively:

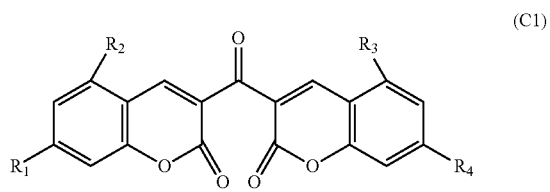

(C1)

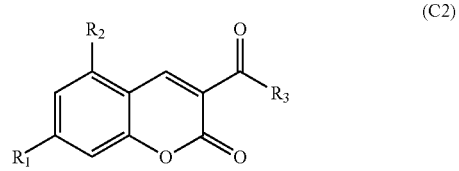

(C2)

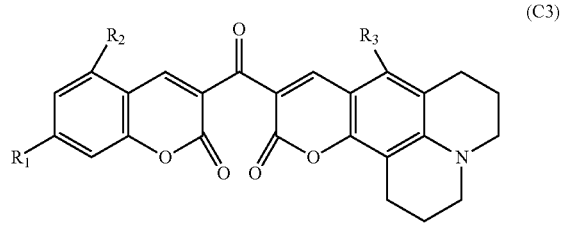

(C3)

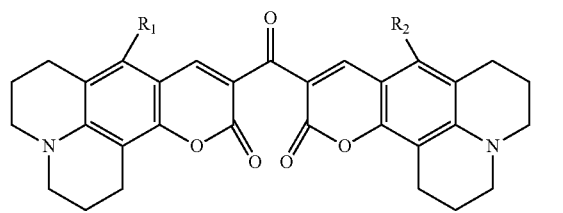

(C4)

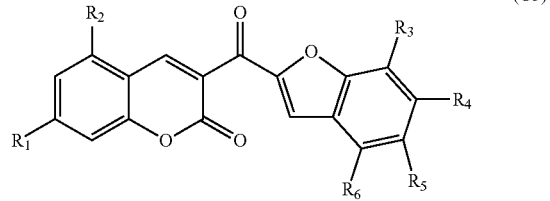

(C5)

Substituents $R_1$, $R_2$, $R_3$, $R_4$, $R_5$, and $R_6$ may be the same or different, and may be jointly, respectively, or independently, any of —SH, —CN, —$NO_2$, —$C_nH_{2n+1}$ (n=0 to 8), —$C_nH_{2n+1}O$ (n=0 to 8), $N(C_nH_{2n+1})_2$ (n=0 to 8), phenyl, thienyl, and thiazolyl.

The co-initiator may be one or more of N,N,N-triethylamine, N-Methyl maleimide, N-ethyl maleimide, triethanolamine, N-phenyl glycine, acetyl phenyl glycine, p-chlorophenyl glycine, 3-bromine phenyl glycine, 3-nitrile phenyl glycine, N-phenyl glycine ethyl ester, 2,4,6-tri(trichloromethyl)-1,3,5-triazine, and 2-(4'-methoxy phenyl)-4,6-bi(trichloromethyl)-1,3,5-triazine.

The visible light photoinitiating system can be used to initiate acrylic ester (e.g. methyl methacrylate, butyl acrylate, 2-Ethylhexyl acrylate, ethylene dimethacrylate, trimethylolpropane trimethacrylate and pentaerythritol tetraacrylate), acrylamide (e.g. methyl acrylamide, N-isopropyl acrylamide, and methylene diacrylamide), N-vinyl monomers (e.g. N-vinyl pyrrolidone, N-vinyl carbazole), and other monomers capable of free radical polymerization, and is suitable for preparing a holographic photopolymer material.

The invention is based on the theory that the photosensitizer transforms from ground state to excited state after absorbing photons, and then interacts with the coinitiator through transfer of electrons and protons, which produces an alkyl (or aryl) free radical R and a ketyl radical K; wherein the free radical R initiates addition polymerization of monomers capable of free radical polymerization, whereas the radical K inhibits the chain propagation of the macromolecular free radicals to a certain degree.

Advantageously, the invention can regulate the photopolymerization rate and gelation time by adjusting the content of the photosensitizer and co-initiator, thereby preparing a holographic photopolymer material with high-diffraction efficiency.

PARTICULAR EMBODIMENTS

Embodiment 1

Add the visible light photoinitiating system (1:10 of photosensitizer to co-initiator by mass) consisting of a 0.1 wt % photosensitizer (C1 and C2 are in the proportion of 1:2; $R_1=R_4=N(C_2H_5)_2$, $R_2=R_3=H$) and a 1 wt % co-initiator (N,N,N-triethylamine, N-Methyl maleimide, and 3-bromine phenyl glycine in the proportion of 1:2:3) to the mixture system which consists of 70 wt % monomers (methyl methacrylate, methyl acrylamide, and N-vinyl pyrrolidone in the proportion of 1:3:1) and a 30 wt % polyvinyl alcohol agglomerant. Then, mix them ultrasonically to become a homogeneous emulsion and make a thin film of 20 µm thick from the emulsion. Place the film into a 441.6 nm laser interference field for 30 seconds of holographic exposure at the exposure intensity of 50 mW/cm² to obtain a holographic photopolymer material with a grating interval of 1 µm and diffraction efficiency of 29%.

Embodiment 2

Add the visible light photoinitiating system (10:1 of photosensitizer to co-initiator by mass) consisting of a 1 wt % photosensitizer (C2 and C4 in the proportion of 2:3; $R_1=C_8H_{17}$, $R_2$=thiazolyl, and $R_3$=OH) and a 0.1 wt % co-initiator (N-ethyl maleimide, N-phenyl glycine, and 2,4,6-tri(trichloromethyl)-1,3,5-triazine in the proportion of 2:2:1) to the mixture system, which consists of 70 wt % monomers (butyl acrylate, 2-Ethylhexyl acrylate, and N-isopropyl acrylamide in the proportion of 1:2:1) and a 30 wt % polyvinyl alcohol agglomerant. Then, agitate them ultrasonically to become a homogeneous emulsion and make a thin film of 20 µm thick from the emulsion. Place the film into a 441.6 nm laser interference field for 30 seconds of holographic exposure at the exposure intensity of 50 mW/cm² to obtain a holographic photopolymer material with a grating interval of 1 µm and diffraction efficiency of 90%.

Embodiment 3

Add the visible light photoinitiating system (20:1 of photosensitizer to co-initiator by mass) consisting of a 10 wt % photosensitizer C3 ($R_1=C_8H_{17}O$, $R_2=NH_2$, and R3=thienyl) and a 0.5 wt % co-initiator (triethanolamine, acetyl phenyl glycine, and 3-nitrile phenyl glycine in the proportion of 2:1:1) to the mixed system, which consists of 60 wt % monomers (ethylene dimethacrylate, trimethylolpropane trimethacrylate, and vinyl carbazole in the proportion of 1:1:4) and a 29.5 wt % polyvinyl alcohol agglomerant. Then, mix them ultrasonically to become a homogeneous emulsion and make a thin film of 20 µm thick. Place the film into a 441.6 nm laser interference field for 30 seconds of holographic exposure at the exposure intensity of 50 mW/cm² to obtain a holographic photopolymer material with a grating interval of 1 µm and diffraction efficiency of 80%.

Embodiment 4

Add the visible light photoinitiating system (1:20 of photosensitizer to co-initiator by mass) consisting of a 0.5 wt % photosensitizer C4 ($R_1=N(C_8H_{17})_2$, $R_2=NO_2$, $R_3=H$) and a 10 wt % co-initiator (p-chlorophenyl glycine, N-phenyl glycine ethyl ester, and 2-(4'-methoxy phenyl)-4,6-bi(trichloromethyl)-1,3,5-triazine in the proportion of 1:1:1) to the mixture system, which consists of 60 wt % monomers (N-vinyl carbazole, pentaerythritol tetraacrylate, and methylene diacrylamide in the proportion of 3:1:4) and a 29.5 wt % polyvinyl alcohol agglomerant. Then, mix them ultrasonically to become a homogeneous emulsion and make a thin film of 20 µm thick from the emulsion. Place the film into a 441.6 nm laser interference field for 30 seconds of holographic exposure at the exposure intensity of 50 mW/cm² to obtain a holographic photopolymer material with a grating interval of 1 µm and diffraction efficiency of 76%.

Embodiment 5

Add the visible light photoinitiating system (1:4 of photosensitizer to co-initiator by mass) consisting of a 2 wt % photosensitizer (C1 and C5 in the proportion of 1:1; $R_1$=phenyl, $R_2=R_3=R_5=H$, $R_4=CN$, $R_6=SH$) and a 8 wt % co-initiator (p-chlorophenyl glycine, N-phenyl glycine ethyl ester, and 2-(4'-methoxy phenyl)-4,6-bi(trichloromethyl)-1,3,5-triazine in the proportion of 1:1:1) to the mixture system, which consists of 60 wt % monomers (butyl acrylate, 2-Ethylhexyl acrylate, and N-vinyl carbazole in the proportion of 1:2:4) and a 30 wt % polyvinyl alcohol agglomerant. Then, mix them ultrasonically to become a homogeneous emulsion and make a thin film of 20 µm thick from the emulsion. Place the film into a 441.6 nm laser interference field for 30 seconds of holographic exposure at the exposure intensity of 100 mW/cm² to obtain a holographic photopolymer material with a grating interval of 1 µm and diffraction efficiency of 89%.

Embodiment 6

Add the visible light photoinitiating system (1:20 of photosensitizer to co-initiator by mass) consisting of a 0.5 wt % photosensitizer C4 ($R_1$=N($C_8H_{17}$)$_2$, $R_2$=$NO_2$, $R_3$=H) and a 10 wt % co-initiator (N-phenyl glycine ethyl ester) to the mixture system, which consists of 60 wt % monomers (N-vinyl carbazole, pentaerythritol tetraacrylate, and methylene diacrylamide in the proportion of 3:1:4) and a 29.5 wt % polyvinyl alcohol agglomerant. Then, mix them ultrasonically to become a homogeneous emulsion and make a thin film of 20 μm thick. Place the film into a 441.6 nm laser interference field for 30 seconds of holographic exposure at the exposure intensity of 50 mW/cm² to obtain a holographic photopolymer material with a grating interval of 1 μm and diffraction efficiency of 86%.

The invention claimed is:

1. A visible light photoinitiating system, comprising a photosensitizer and a co-initiator, within which system an alkyl or aryl free radical for initiating photopolymerization and a ketyl radical for inhibiting photopolymerization are generated upon exposure to a single laser beam, wherein said photosensitizer comprises one or more selected from the group consisting of C1, C2, C3, C4, and C5, said C1, C2, C3, C4, and C5 having the following structures, respectively:

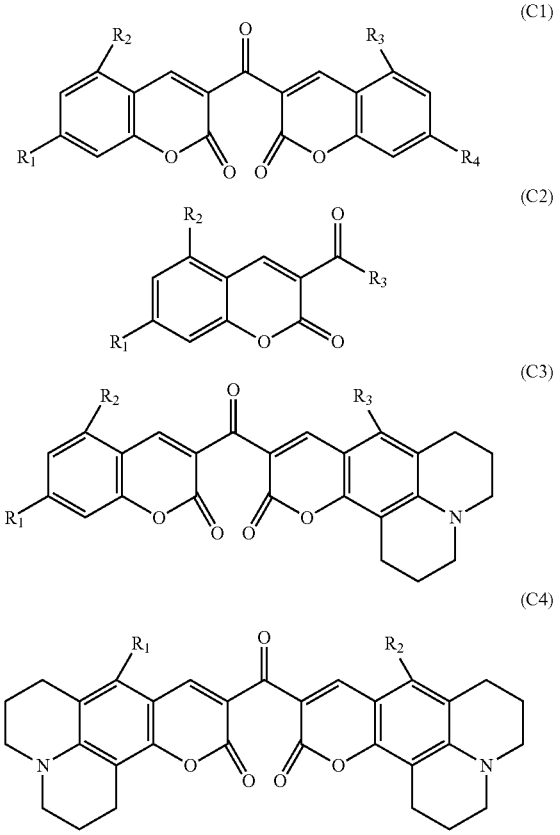

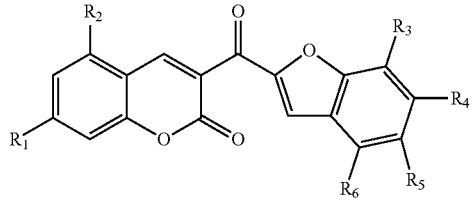

wherein substitutes $R_1$, $R_2$, $R_3$, $R_4$, $R_5$, and R6 may be same or different, and may be jointly, respectively or independent, and of —SH, —CN, —$NO_2$, —$C_nH_{2n+1}$ (n≤0 to 8), —$C_nH_{2n+1}$O (n=0 to 8), N($C_nH_{2n+1}$)$_2$ (n=0 to 8), phenyl, thienyl, and thiazolyl.

2. The photoinitiating system according to claim 1, wherein a ratio by mass of the photosensitizer to the co-initiator is between 20:1 and 1:20.

3. The visible light photoinitiating system according to claim 1, wherein said co-initiator comprises one or more selected from the group consisting of N,N,N-triethylamine, N-Methyl maleimide, N-ethyl maleimide, triethanolamine N-phenyl glycine, acetyl phenyl glycine, p-chlorophenyl glycine, 3-bromine phenyl glycine, 3-nitrile phenyl glycine, N-phenyl glycine ethyl ester, 2,4,6-tri(trichloromethyl)-1,3,5-triazine, and 2-(4'-methoxy phenyl)-4,6-bi(trichloromethyl)-1,3,5-triazine.

4. The visible light photoinitiating system according to claim 1, wherein C2 is other than 3-acetylcoumarin.

5. The visible light photoinitiating system according to claim 1, wherein said photosensitizer comprises at least one photosensitizer or photosensitizer combination selected from the group consisting of:
C1 and C2 in the proportion of 1:2, wherein $R_1$=$R_4$=N($C_2H_5$)$_2$ and $R_2$=$R_3$=H);
C2 and C4 in the proportion of 2:3, wherein $R_1$=$C_8H_{17}$, $R_2$=thiazolyl, and $R_3$=OH;
C3, wherein $R_1$=$C_8H_{17}$O, $R_2$=$NH_2$, and $R_3$=thienyl;
C4, wherein $R_1$=N($C_8H_{17}$)$_2$, $R_2$=$NO_2$, and $R_3$=H; and
C1 and C5 in the proportion of 1:1, wherein $R_1$=phenyl, $R_2$=$R_3$=$R_5$=H, $R_4$=CN, and $R_6$=SH.

6. The visible light photoinitiating system according to claim 1, in combination with a non-epoxy polymerizable material.

7. The visible light photoinitiating system according to claim 5, wherein the non-epoxy polymerizable material comprises one or more selected from the group consisting of methyl methacrylate, methyl acrylamide, N-vinyl pyrrolidone, butyl acrylate, 2-ethylhexyl acrylate, N-isopropyl acrylamide, ethylene dimethacrylate, trimethylolpropane trimethacrylate, N-vinyl carbazole, pentaerythritol tetraacrylate, and methylene diacrylamide.

8. The visible light photoinitiating system according to claim 1, wherein the laser beam has a wavelength of 441.6 nm.

* * * * *